United States Patent
Yun

(10) Patent No.: US 8,790,130 B2
(45) Date of Patent: Jul. 29, 2014

(54) FLEXIBLE PRINTED CIRCUIT (PC) BOARD, JUNCTION METHOD THEREOF, AND BATTERY PACK USING THE FLEXIBLE PC BOARD

(75) Inventor: Chang-Yong Yun, Suwon-si (KR)

(73) Assignee: Samsung SDI Co., Ltd., Giheung-gu, Yongin-si, Gyeonggi-do (KR)

( * ) Notice: Subject to any disclaimer, the term of this patent is extended or adjusted under 35 U.S.C. 154(b) by 1629 days.

(21) Appl. No.: 12/285,243

(22) Filed: Sep. 30, 2008

(65) Prior Publication Data

US 2009/0117458 A1    May 7, 2009

(30) Foreign Application Priority Data

Nov. 1, 2007  (KR) .................. 10-2007-0110922

(51) Int. Cl.
*H01M 10/42* (2006.01)
*H01M 2/10* (2006.01)

(52) U.S. Cl.
CPC ............ *H01M 10/42* (2013.01); *H01M 10/425* (2013.01); *H01M 2/1061* (2013.01); *H05K 2201/0989* (2013.01)
USPC .......................................... 439/504; 429/159

(58) Field of Classification Search
CPC . H01M 2/1061; H01M 10/425; H01M 10/42; H05K 2201/0989
USPC ........................ 429/159; 439/504, 519–522
See application file for complete search history.

(56) References Cited

U.S. PATENT DOCUMENTS

| | | | |
|---|---|---|---|
| 7,059,769 B1 * | 6/2006 | Potega | 374/185 |
| 2004/0145877 A1 * | 7/2004 | Fujiyama et al. | 361/763 |
| 2006/0019155 A1 * | 1/2006 | Seman et al. | 429/159 |
| 2007/0054180 A1 * | 3/2007 | Miyajima et al. | 429/96 |
| 2007/0184341 A1 * | 8/2007 | Yoon et al. | 429/152 |
| 2009/0017370 A1 * | 1/2009 | Louie | 429/129 |

FOREIGN PATENT DOCUMENTS

| | | |
|---|---|---|
| JP | 05-291769 | 11/1993 |
| JP | 2002-358026 | 12/2002 |
| JP | 2003-124583 | 4/2003 |
| JP | 2006-344950 | 12/2006 |
| KR | 10-1999-0077664 A | 10/1999 |
| KR | 10-0396869 | 8/2003 |
| KR | 10-2006-0077693 | 7/2006 |
| KR | 10-2006-0103460 | 9/2006 |
| WO | WO 2005/066992 | 7/2005 |

OTHER PUBLICATIONS

Korean Office Action issued on Nov. 28, 2008 in the corresponding Korean Patent application No. 10-2007-0110922.
Transmittal letter, along with a Korean Notice of Allowability issued on May 28, 2009 for corresponding Korean Patent Application No. 2007-0110922.

* cited by examiner

*Primary Examiner* — Milton I Cano
*Assistant Examiner* — Stephen Yanchuk
(74) *Attorney, Agent, or Firm* — Robert E. Bushnell, Esq.

(57) ABSTRACT

A flexible Printed Circuit (PC) board, junction method thereof and battery pack using the flexible PC board prevents cracking of terminal units of a flexible PC board and reducing degradation thereof due to deformation by increasing its tensile strength. The flexible PC board has a multi-layered structure including wiring with terminal units, a first insulating layer and a second insulating layer arranged both over and under the wiring. An end of the second insulating layer is arranged between an end of the terminal units and an end of the first insulating layer.

20 Claims, 3 Drawing Sheets

FLEXIBLE PRINTED CIRCUIT (PC) BOARD, JUNCTION METHOD THEREOF, AND BATTERY PACK USING THE FLEXIBLE PC BOARD

CLAIM OF PRIORITY

This application makes reference to, incorporates the same herein, and claims all benefits accruing under 35 U.S.C. §119 from an application for FLEXIBLE PRINTED CIRCUIT BOARD, JUNCTION METHOD THEREOF, AND BATTERY PACK USING THE SAME earlier filed in the Korean Intellectual Property Office on the 1 Nov. 2007 and there duly assigned Serial No. 2007-0110922.

BACKGROUND OF THE INVENTION

1. Field of the Invention

The present invention relates to a flexible Printed Circuit (PC) board, junction method thereof and a battery pack using the flexible PC board to prevent cracking of terminal units of a flexible PC board and to reduce degradation thereof due to deformation by increasing tensile strength.

2. Description of the Related Art

A flexible PC board refers to a board on which minute circuits are printed on thin films of flexible plastic materials, and which has been developed to service the industrial tendency toward high density, compact size and high functionality in electrical and electronic products.

The flexible PC board is capable of highly dense three-dimensional wiring, higher durability for repeated bending, less wiring degradation, and superior assembly.

Therefore, it has been widely used in cameras, computers, computer peripheral devices, hand-held phones, video/audio devices, camcorders, printers, Thin Film Transistor Liquid Crystal Devices (TFT LCDs), satellite systems and medical equipment, and so on.

The flexible PC board generally has a multi-layer structure wherein wiring of either copper or nickel is formed on a flexible substrate of conductive insulating sheets, such as polyethylene terephthalate (PET) and polyimide (PI), and a coverlay of insulating film for protecting circuits is stacked thereon.

The flexible PC board is capable of electrical connections between separated circuit boards when placed therebetween.

In a case of a hand-held phone with a main body and a folding portion that can be folded and connected by a hinge, the flexible PC board connects a main substrate incorporated in the main body and an auxiliary substrate incorporated in the folding portion for operating an LCD panel therein, so that the main substrate and the auxiliary substrate can both transmit and receive signals to and from each other.

In a case where the flexible PC board is connected to another circuit substrate, as above, wiring terminals of wiring formed in the flexible substrate may be exposed and connected to connecting units of another circuit substrate.

Conventionally, the wiring terminals are exposed by removing some portion corresponding to the wiring terminals to expose both the flexible substrate and the coverlay that are placed on both sides of the center of the wiring.

SUMMARY OF THE INVENTION

An object of the present invention is to provide a flexible Printed Circuit (PC) board, a junction method thereof and a battery pack using the flexible PC board to prevent cracking of terminal units of a flexible PC board and to reduce degradation thereof due to deformation by increasing tensile strength.

These and other objects of the present invention may be achieved by providing a flexible Printed Circuit (PC) board having a multi-layered structure including wiring with terminal units, a first insulating layer and a second insulating layer placed both over and under the wiring, and an end of the second insulating layer is arranged between an end of the terminal units and an end of the first insulating layer.

The first insulating layer may include either polyethylene terephthalate (PET) or polyimide (PI).

The second insulating layer may include an insulating film to protect electrical circuits.

The wiring may include either copper or nickel.

These and other objects of the present invention may also be achieved by providing a method of using a flexible Printed Circuit (PC) board to electrically connect circuit boards by arranging a flexible PC board between the circuit boards, the method including: providing the flexible PC board having a multi-layered structure including a wiring having a first terminal unit, a first insulating layer and a second insulating layer arranged over and under the wiring, an end of the second insulating layer being arranged between an end of the terminal unit and an end of the first insulating layer; and providing a circuit board including a second terminal unit; and, joining the first terminal unit to the second terminal unit.

The first terminal unit may be joined to the second terminal unit by soldering.

The first terminal unit may include a bottom surface contacting the second terminal and a top surface opposing the bottom surface, and the top surface is soldered to wrap an exposed surface of the top surface.

The first insulating layer may be arranged on sides of the bottom surface, and the second insulating layer is arranged on sides of the top surface.

Joining may be effected to facilitate an end of the bottom surface maintaining certain intervals with one of the circuit boards.

The first insulating layer may include either polyethylene terephthalate (PET) or polyimide (PI).

The second insulating layer may include an insulating film for protecting electrical circuits.

These and other objects of the present invention may also be achieved by providing a battery pack including a flexible Printed Circuit (PC) board having a multi-layered structure including wiring with terminal units, a first insulating layer and a second insulating layer placed both over and under the wiring, and an end of the second insulating layer is placed between an end of the terminal units and an end of the first insulating layer.

The battery pack may include a first battery having a plurality of bare cells, a second battery having at least a bare cell, a first protection circuit board having a first pad unit and connecting to the first battery, and a second protection circuit board having a second pad unit and connecting to the second battery, and the terminal unit of the flexible PC board includes a first and second terminal unit, and the first terminal unit is electrically connected to the first pad unit, and the second terminal unit is electrically connected to the second pad unit.

Both the first terminal unit and the second terminal unit may include a bottom surface contacting the first and second pad units, respectively, and a top surface opposing the bottom surface, and the first insulating layer is arranged below the bottom surface and the second insulating layer is arranged on the upper surface.

The first insulating layer may include either polyethylene terephthalate (PET) or polyimide (PI).

The second insulating layer may include an insulating film to protect electrical circuits.

The wiring may include either copper or nickel.

BRIEF DESCRIPTION OF THE DRAWINGS

A more complete appreciation of the present invention, and many of the attendant advantages thereof, will be readily apparent as the present invention becomes better understood by reference to the following detailed description when considered in conjunction with the accompanying drawings in which like reference symbols indicate the same or similar components, wherein.

DETAILED DESCRIPTION OF THE INVENTION

The present invention is described more fully hereinafter with reference to the accompanying drawings, in which exemplary embodiments of the present invention are shown.

Figure 1A:
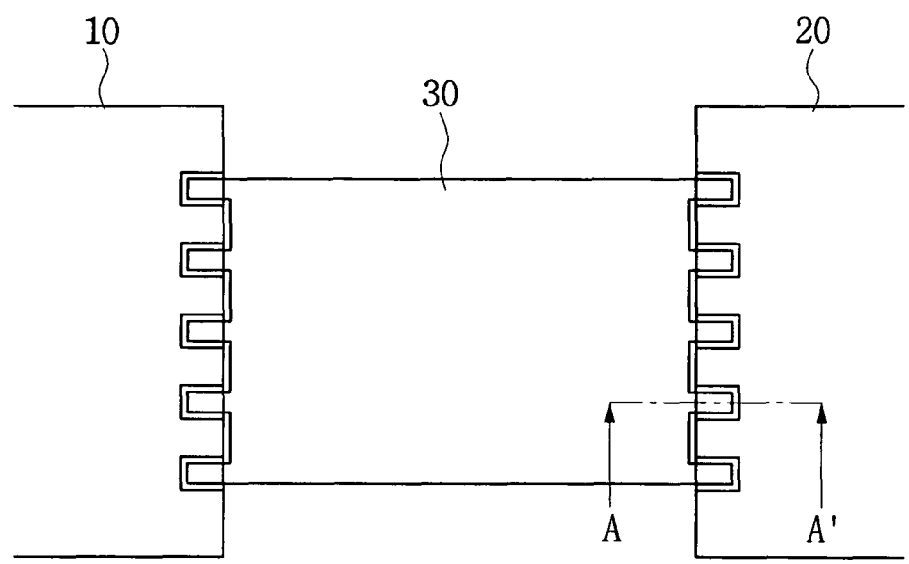
FIG. 1A is a plan view of two circuit boards connected by a flexible PC board according to an exemplary embodiment of the present invention.
Figure 1B:
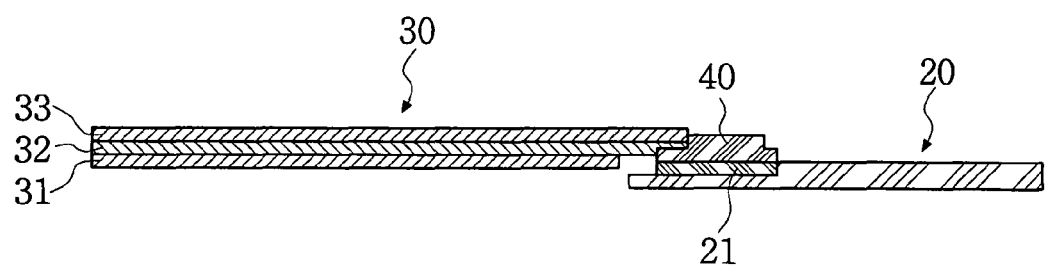
FIG. 1B is a cross-sectional view taken along the line A-A' of FIG. 1A.
Figure 1C:
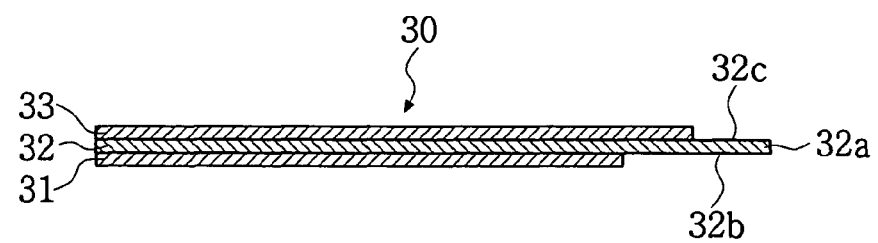
FIG. 1C is a flexible PC board according to an exemplary embodiment of the present invention.

FIG. 1A is a plan view of two circuit boards connected by a flexible PC board according to an exemplary embodiment of the present invention, FIG. 1B is a cross-sectional view taken along the line A-A' of FIG. 1A, and FIG. 1C is a flexible PC board according to an exemplary embodiment of the present invention.

Referring to FIG. 1A, a flexible PC board 30 is placed between two different circuit boards 10 and 20 and the flexible PC board 30 to electrically connect the two different circuit boards 10 and 20.

The circuit boards 10 and 20 may be protection circuit boards incorporating protection circuit devices and arranged on a side of a battery for preventing accidents due to an abnormal operation of the battery. The circuit boards 10 and 20 may be a main board incorporated in a main body of a hand-held phone and an auxiliary board for operating an LCD panel incorporated in a folding portion of the hand-held phone.

Referring to FIG. 1B, the circuit board 20 and the flexible PC board 30 may be joined and fixed by soldering with metal materials 40, such as tin/lead or lead solder, etc.

Referring to FIG. 1C, the flexible PC board 30 according to the present invention may have a multi-layered structure in which a first insulating layer 31 and a second insulating layer 33 are formed both on and beneath wiring 32. The wiring 32 may include terminals and be made of either copper or nickel.

The first insulating layer 31 may be a flexible board of an insulating sheet, such as polyethylene terephthalate (PET) or polyimide (PI), and the second insulating layer 33 be a coverlay, such as an insulating film for circuit protection.

An end of the wiring 32 of the flexible PC board 30 may be a first terminal 32a to electrically connect the wiring 32 to a circuit unit of the circuit board 20. The first terminal 32a may be joined to a second terminal 21 formed on the circuit board 20 by soldering.

The first terminal 32a may outwardly protrude from ends of both the first insulating layer 31 and the second insulating layer 33.

Furthermore, a bottom surface 32b of the first terminal 32a may contact the second terminal 21, and an end of an insulating layer (the second insulating layer 33 of the exemplary embodiment) placed on the top surface 32c may more outwardly protrude than an end of an insulating layer (the first insulating layer 31 of the exemplary embodiment) placed on the bottom surface 32b.

In conclusion, the end of the second insulating layer 33 may be placed between the ends of both the first terminal 32a and the first insulating layer 31.

The second terminal 21 may be formed on the circuit board 20 by joining to the first terminal 32a of the flexible PC board 30, and the first terminal 32a and the second terminal 21 may be joined and fixed by soldering with metal materials 40, such as tin/lead or lead solder, etc.

It is preferable that the top surface 32c is not exposed upon soldering by covering the top surface 32c with solder.

Moreover, it is preferable that a portion of the bottom surface 32b of the first terminal 32a is exposed by forming an end of the first insulating layer 31 placed on the bottom surface 32b of the first terminal 32a while maintaining regular intervals with the circuit board 20, thereby acquiring a space between the flexible PC board 30 and the circuit board 20.

Since movement is restricted for both the flexible printed board and the circuit board when the space is narrow, and the deformation of both the flexible printed board and the circuit board easily occurs due to repetitive bending when the space is too wide, it is preferable that the space be adequately determined by those skilled in the art.

Accordingly, it is possible to prevent an occurrence of a crack at the first terminal 32a by selecting the space and reducing degradation thereof, such as a deformity resulting from an increased tensile force, by wrapping the second insulating layer 33 when the first terminal 32a is bent. Therefore, the first terminal 32a may have a greater junction strength than soldering just the bottom surface of the first terminal 32a.

Moreover, since the junction of both the first terminal 32a and the second terminal 21 is carried out by soldering, damage may not occur due to the pressure and heat generated by using compression tool.

FIGS. 1A through 1C illustrates a structure and a method in which two circuit boards are connected by using a flexible PC board. However, the present invention is not limited thereto.

Figure 2A:
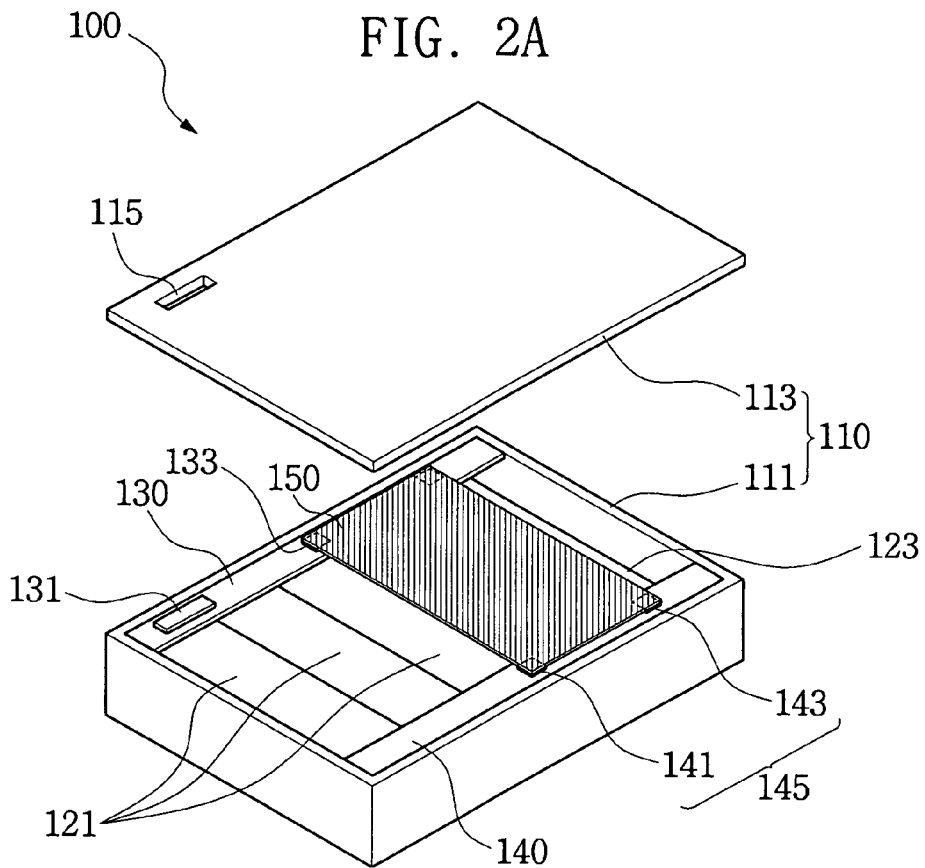
FIG. 2A is an exemplary embodiment of a battery pack including the flexible PC board according to the present invention.
Figure 2B:
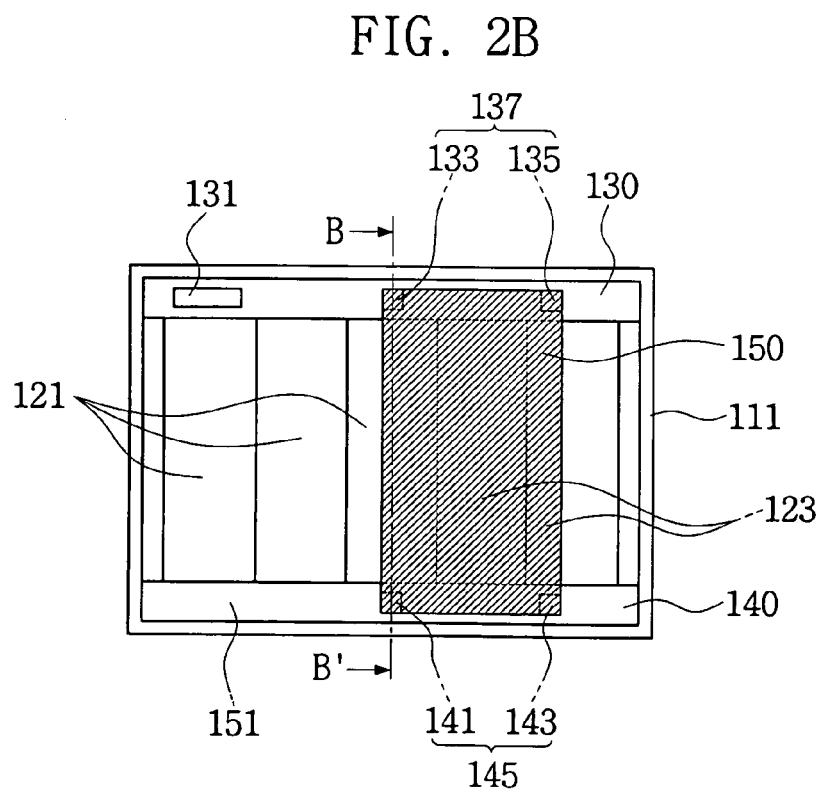
FIG. 2B is a plan view of the battery pack of FIG. 2A.
Figure 2C:
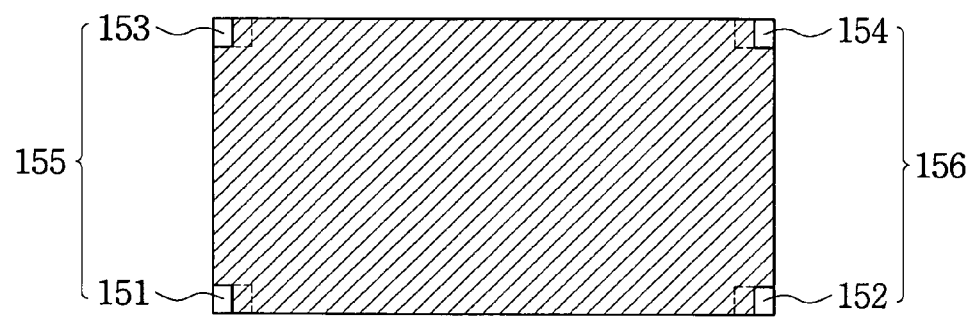
FIG. 2C is a plan view of the flexible PC board of FIG. 2B.
Figure 2D:
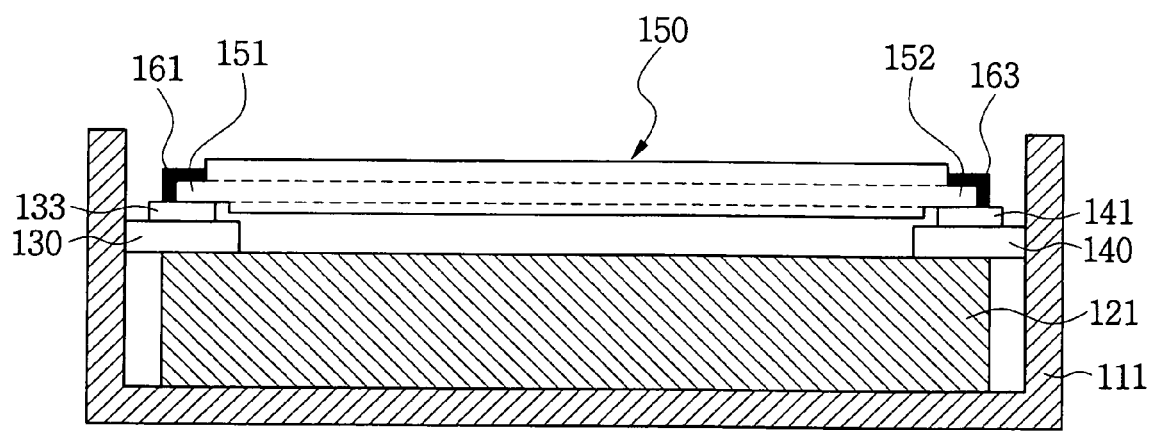
FIG. 2D is a cross-sectional view taken along the line B-B' of FIG. 2B.

FIG. 2A illustrates an exemplary embodiment of a battery pack including the flexible PC board according to the present invention, FIG. 2B illustrates a plan view of a battery pack of FIG. 2A, FIG. 2C illustrates a plan view of the flexible PC board of FIG. 2B, and FIG. 2D illustrates a cross-sectional view taken along the line B-B' of FIG. 2B.

Referring to FIGS. 2A and 2B, a battery pack 100 includes a case 110 having a lower case 111 and an upper case 113, both first and second battery units 121 and 123 accommodated in the case 110, and both first and second protection circuit boards 130 and 140.

Moreover, the battery pack 100 includes a flexible PC board for electrically connecting both the first and second protection circuit board 130 and 140.

As illustrated in FIG. 2A, the battery pack 100 may be formed by joining the upper case 113 to the lower case 111, after accommodating both the first and second battery units 121 and 123, both first and second protection circuit boards 130 and 140, and the flexible PC board 150 into the lower case 111. However, the shape of a battery pack in accordance with the present invention is not limited thereto.

Either the upper case 113 or the lower case 111 may be formed by disposing a terminal withdrawing unit at one side so as to expose an external connecting terminal.

The first battery unit 121 may include a plurality of bare cells, and the second battery unit 123 may include at least one bare cell.

The bare cells may be formed by sealing a casing in which the electrode assembly is accommodated, and may include a cap assembly for sealing.

The electrode assembly may be formed by stacking and winding a positive electrode plate, a negative electrode plate and separator interposed between the positive electrode plate and the negative electrode plate.

Moreover, the bare cell may be formed in a cylindrical shape, a square shape or pouch shape. However, the shape is not limited to the exemplary embodiment of the present invention.

Both the first and second protection circuit boards 130 and 140 may be electrically connected to both the first and second batteries, respectively. Either of the protection circuit boards may include an outer connecting terminal 131 for electrically connecting to an external device.

The exemplary embodiment of the present invention includes the outer connecting terminal 131 formed on the first protection circuit board 130, and its corresponding terminal fetching unit 115 formed on the upper case 113.

Moreover, the first protection circuit board 130 includes a first pad unit 137 having both a first pad 133 and a second pad 135, and the second protection circuit board 140 includes a second pad unit 145 having both a third pad 141 and a fourth pad 143.

The first pad 133 and the third pad 141 may have the same polarity and are electrically connected to each other. The second and the fourth pad have the same polarity and are electrically connected to each other.

The flexible PC board 150 electrically connects the first pad unit 137 of the first protection circuit board 130 to the second pad unit 145 of the second protection circuit board 140, and its configuration is the same as those in the flexible PC board 30 of FIGS. 1A through 1C, and accordingly, a detailed description thereof has been omitted.

Referring to FIG. 2C, the flexible PC board 150 includes a first terminal unit 155 connected to the first pad unit 137, and a second terminal unit 156 connected to the second pad unit 145.

The first terminal unit 155 includes both a first terminal 151 and a second terminal 153 connected to both the first pad 133 and the second pad 135, respectively, and the second terminal unit 158 includes both the third terminal 152 and the fourth terminal 154 connected to both the third pad 141 and the fourth pad 143, respectively.

The exemplary embodiment illustrates two terminals of both the first and second pad units 137 and 145, and the first and second terminal units 155 and 156, respectively. However, it will be understood by those skilled in the art that the number of terminals may be varied.

Referring to FIG. 2D, the first pad 133 of the first pad unit 137 of the first protection circuit board 130 is connected to the first terminal 151 of the first terminal unit 155 of the flexible PC board 150, and the third pad 141 of the second pad unit 145 of the second protection circuit board 140 is connected to the third terminal 152 of the second terminal unit 156 of the flexible PC board 150.

Connections may be implemented in soldering, respectively, and accordingly, soldering units 161 and 163 may be formed.

The method of connecting through the soldering is illustrated in FIGS. 1A through 1C, and accordingly, a detailed description thereof has been omitted.

Moreover, according to the same method, the second pad 135 of the first pad unit 137 of the first protection circuit board 130 may be connected to the second terminal 153 of the first terminal unit 155 of the flexible PC board 150, and the fourth pad 143 of the second pad unit 145 of the second protection circuit board 140 may be connected to the fourth terminal 154 of the second terminal unit 156 of the flexible PC board 150.

Although the present invention has been described with reference to certain exemplary embodiments thereof, it will be understood by those skilled in the art that a variety of modifications and variations may be made to the present invention without departing from the spirit or scope of the present invention as defined by the appended claims.

What is claimed is:

1. A flexible Printed Circuit (PC) board having a multi-layered structure comprising a wiring with terminal units, a first insulating layer and a second insulating layer placed both over and under the wiring in a thickness direction of the flexible PC, wherein an end of the second insulating layer is arranged, in a longitudinal direction of the flexible PC board that is perpendicular to the thickness direction, between an end of the terminal units and an end of the first insulating layer, wherein the wiring projects out further in the longitudinal direction from side edges of the flexible PC board than either of the first and the second insulating layers.

2. The flexible PC board of claim 1, wherein the first insulating layer comprises either polyethylene terephthalate (PET) or polyimide (PI).

3. The flexible PC board of claim 1, wherein the terminal units are arranged on a same layer as the wiring and are part of the wiring, wherein a bottom surface of the terminal units are recessed from a bottom surface of the flexible PB board by a distance equal to a thickness of the second insulating layer.

4. The flexible PC board of claim 1, wherein the wiring comprises either copper or nickel.

5. A battery pack comprising a flexible Printed Circuit (PC) board having a multi-layered structure comprising wiring with terminal units, a first insulating layer and a second insulating layer placed both under and over the wiring respectively in a thickness direction of the flexible PC board, wherein an end of the second insulating layer is arranged, in a longitudinal direction of the flexible PC board that is perpendicular to the thickness direction, between an end of the terminal units and an end of the first insulating layer, wherein the wiring projects out further in the longitudinal direction from side edges of the flexible PC board than either of the first and the second insulating layers.

6. The battery pack of claim 5, wherein the battery pack comprises a first battery having a plurality of bare cells, a second battery having at least a bare cell, a first protection circuit board having a first pad unit and connecting to the first battery, and a second protection circuit board having a second pad unit and connecting to the second battery, and wherein the terminal unit of the flexible PC board comprises a first and a second terminal unit, and wherein the first terminal unit is electrically connected to the first pad unit, and the second terminal unit is electrically connected to the second pad unit.

7. The battery pack of claim 6, wherein both the first terminal unit and the second terminal unit comprise a bottom surface contacting the first and second pad units, respectively, and a top surface opposing the bottom surface, and wherein the first insulating layer is arranged below the bottom surface and the second insulating layer is arranged on the upper surface.

8. The battery pack of claim 6, wherein the first insulating layer comprises either polyethylene terephthalate (PET) or polyimide (PI).

9. The battery pack of claim 6, wherein the terminal units are arranged on a same layer as the wiring and are part of the wiring, wherein a bottom surface of the terminal units are recessed from a bottom surface of the flexible PB board by a distance equal to a thickness of the first insulating layer.

10. The battery pack of claim 5, wherein the wiring comprises either copper or nickel.

11. A battery pack, comprising:
the flexible printed circuit board of claim 1 wherein the terminal units comprise a first terminal unit opposite a second terminal unit taken in the longitudinal direction of the flexible PC board;
a first circuit board attached to and in contact with the first terminal unit; and
a second circuit board attached to and in contact with the second terminal unit, the flexible printed circuit board to electrically connect the second circuit board to the first circuit board.

12. The battery pack of claim 1, wherein the wiring is a layer and an entirety of the wiring is arranged beneath the first insulating layer and above the second insulating layer in the thickness direction of the flexible PC.

13. A battery pack, comprising a flexible printed circuit (PC) board comprising:
a wiring layer including a first terminal unit arranged at a first end of the flexible PC board;
a first insulating layer arranged on a bottom surface of the wiring layer in a thickness direction of the flexible PC board; and
a second insulating layer arranged on a top surface of the wiring layer in the thickness direction of the flexible PC board, wherein an end of the second insulating layer in a vicinity of the first end of the flexible PC board is arranged in between an end of the first terminal unit and an end of the first insulating layer taken in a longitudinal direction of the flexible PC that is perpendicular to the thickness direction, wherein the wiring layer projects out further in the longitudinal direction from side edges of the flexible PC board than either of the first and the second insulating layers.

14. The battery pack of claim 13, wherein the second insulating layer extends further to a first end of the flexible PC board taken in the longitudinal direction of the flexible PC board than the first insulating layer, and the first terminal unit of the wiring layer extends further to the first end of the flexible PC board taken in the longitudinal direction of the flexible PC board than the second insulating layer.

15. The battery pack of claim 13, further comprising:
a first battery including a plurality of bare cells;
a first protection circuit board connected to the first battery and including a first pad unit on a top side thereof, wherein the first terminal unit of the flexible PC board comprises a bottom surface that contacts the first pad unit; and
a solder joining the first terminal unit of the flexible PC board to the first pad unit of the first protection circuit board.

16. The battery pack of claim 15, wherein a top surface of the wiring layer includes a first portion covered by solder and a second portion covered by the second insulating layer, wherein none of the top surface of the wiring is exposed.

17. The battery pack of claim 15, wherein on a bottom surface of the wiring layer, the end of the first insulating layer is spaced-apart in the longitudinal direction of the flexible PC board from the first protection circuit board by a gap that exposes a portion of the bottom surface of the wiring layer in a vicinity of the first terminal unit.

18. The battery pack of claim 13, further comprising:
a second battery including at least one bare cell;
a second protection circuit board connected to the second battery and including a second pad unit on a top side thereof, wherein the flexible PC board further includes a second terminal unit arranged at a second end of the flexible PC board that is opposite from the first terminal unit in the longitudinal direction of the flexible PC board, wherein a bottom surface of the second terminal unit contacts the second pad unit; and
a solder joining the second terminal unit of the flexible PC board to the second pad unit of the second protection circuit board.

19. The rechargeable battery of claim 18, wherein on a bottom surface of the wiring layer at the second end of the flexible PC board, the end of the first insulating layer is spaced-apart in the longitudinal direction of the flexible PC board from the second protection circuit board by a gap that exposes a portion of the bottom surface of the wiring layer in a vicinity of the second terminal unit.

20. The rechargeable battery of claim 11, wherein on a bottom surface of the wiring layer in the vicinity of the second terminal unit, the end of the second insulating layer is spaced-apart in the longitudinal direction of the flexible PC board from the second protection circuit board by a gap that exposes a portion of the bottom surface of the wiring layer in the vicinity of the second terminal unit.

* * * * *